United States Patent
Murphy et al.

(10) Patent No.: US 9,868,898 B2
(45) Date of Patent: *Jan. 16, 2018

(54) PROCESSES FOR PREPARING COLOR STABLE RED-EMITTING PHOSPHORS

(71) Applicant: GENERAL ELECTRIC COMPANY, Schenectady, NY (US)

(72) Inventors: James Edward Murphy, Niskayuna, NY (US); Fangming Du, Hudson, OH (US); Anant Achyut Setlur, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/197,897

(22) Filed: Jun. 30, 2016

(65) Prior Publication Data

US 2016/0312114 A1 Oct. 27, 2016

Related U.S. Application Data

(63) Continuation-in-part of application No. 14/208,592, filed on Mar. 13, 2014.

(60) Provisional application No. 61/791,511, filed on Mar. 15, 2013.

(51) Int. Cl.
| | |
|---|---|
| *C09K 11/61* | (2006.01) |
| *C09K 11/66* | (2006.01) |
| *C09K 11/64* | (2006.01) |
| *H01L 33/50* | (2010.01) |

(52) U.S. Cl.
CPC ...... *C09K 11/616* (2013.01); *C09K 2211/181* (2013.01); *C09K 2211/188* (2013.01); *H01L 33/502* (2013.01); *H01L 2224/48091* (2013.01); *H01L 2224/48247* (2013.01); *H01L 2924/00014* (2013.01); *H01L 2924/181* (2013.01)

(58) Field of Classification Search
CPC ... C09K 11/616; C09K 11/617; C09K 11/675; C09K 11/628; C09K 11/645; C09K 11/665; C09K 11/664; C09K 11/02; C09K 11/0838; C09K 2211/181; C09K 2211/188; H01L 33/502; H01L 33/504; H01L 33/507; H01L 33/52; H05B 33/14; Y02B 20/181; Y10T 428/2991
USPC ...... 252/301.4 F, 301.4 H, 301.4 R, 301.6 F; 313/486, 503; 362/84, 97.1; 428/403; 257/98

See application file for complete search history.

(56) References Cited

U.S. PATENT DOCUMENTS

| | | | |
|---|---|---|---|
| 4,402,924 | A | 9/1983 | McVicker et al. |
| 4,405,379 | A | 9/1983 | Chasteen |
| 6,416,589 | B1 | 7/2002 | Lipkin et al. |
| 7,358,542 | B2 | 4/2008 | Radkov et al. |
| 7,497,973 | B2 | 3/2009 | Radkov et al. |
| 7,648,649 | B2 | 1/2010 | Radkov et al. |
| 8,252,613 | B1 | 8/2012 | Lyons et al. |
| 8,906,724 | B2 * | 12/2014 | Murphy ............... H01L 33/502 438/34 |
| 9,371,481 | B2 * | 6/2016 | Garcia ................. H05B 33/12 |
| 9,376,615 | B2 * | 6/2016 | Murphy .............. C09K 11/617 |
| 9,385,282 | B2 * | 7/2016 | Setlur .................. H01L 33/502 |
| 9,512,356 | B2 * | 12/2016 | Lyons ................. C09K 11/617 |
| 9,546,318 | B2 * | 1/2017 | Murphy .............. C09K 11/617 |
| 9,567,516 | B2 * | 2/2017 | Murphy .................... F21K 9/60 |
| 2011/0076217 | A1 | 3/2011 | Parthier et al. |
| 2015/0054400 | A1 | 2/2015 | Murphy |
| 2015/0361337 | A1 | 12/2015 | Murphy et al. |
| 2016/0122633 | A1 * | 5/2016 | Kaneyoshi ........... C09K 11/617 252/301.4 F |

OTHER PUBLICATIONS

Pastor et al., "Crystal growth of alkaline earth fluorides in a reactive atmosphere Part III", Materials Research Bulletin, vol. 11, Issue: 10, pp. 1327-1334, Oct. 1976.
R C Pastor, "Crystal growth of metal fluorides for CO2 laser operation I. The necessity of the RAP approach", Journal of Crystal Growth, vol. 200, Issue: 3-4, pp. 510-514, Apr. 1999.
Basiev et al., "Fluoride optical nanoceramics", Russian Chemical Bulletin, International Edition, vol. 57, Issue: 5, pp. 877-886, May 2008.

* cited by examiner

*Primary Examiner* — Matthew E Hoban
*Assistant Examiner* — Lynne Edmondson
(74) *Attorney, Agent, or Firm* — Nitin N. Joshi

(57) ABSTRACT

Processes for preparing color stable $Mn^{4+}$ doped phosphors include contacting a phosphor of formula I with a fluorine-containing oxidizing agent in gaseous form at temperature ≤225° C. to form the color stable $Mn^{4+}$ doped phosphor $$A_xMF_y:Mn^{4+} \qquad I$$

wherein
A is independently at each occurrence Li, Na, K, Rb, Cs, or a combination thereof;
M is independently at each occurrence Si, Ge, Sn, Ti, Zr, Al, Ga, In, Sc, Hf, Y, La, Nb, Ta, Bi, Gd, or a combination thereof;
x is the absolute value of the charge of the $MF_y$ ion; and
y is 5, 6 or 7.
In another aspect, the processes include contacting a phosphor of formula I at an elevated temperature with an oxidizing agent comprising a $C_1$-$C_4$ fluorocarbon, to form the color stable $Mn^{4+}$ doped phosphor.

18 Claims, 3 Drawing Sheets

PROCESSES FOR PREPARING COLOR STABLE RED-EMITTING PHOSPHORS

CROSS-REFERENCE TO RELATED APPLICATIONS

This application is a continuation-in-part of U.S. application Ser. No. 14/208,592, filed on Mar. 13, 2014, now copending which claims the benefit of U.S. Provisional Application No. 61/791,511, filed on Mar. 15, 2013, and is related to U.S. patent application entitled PROCESSES FOR PREPARING COLOR STABLE RED-EMITTING PHOSPHORS filed concurrently herewith.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

One potential limitation in using $Mn^{4+}$ doped fluoride hosts is their susceptibility to degradation under high temperature and humidity (HTHH) conditions. It is possible to reduce this degradation using post-synthesis processing steps, as described in U.S. Pat. Nos. 8,252,613, 8,710,487, 8,906,724, and other patent applications assigned to General Electric Company. However, further improvement in stability of the materials is desirable.

BRIEF DESCRIPTION

Briefly, the present invention relates to processes for preparing color stable $Mn^{4+}$ doped phosphors. In one aspect, a phosphor of formula I is contacted with a fluorine-containing oxidizing agent in gaseous form at temperature ≤225° C. to form the color stable $Mn^{4+}$ doped phosphor

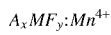

$$A_xMF_y:Mn^{4+} \qquad \text{I}$$

wherein
  A is independently at each occurrence Li, Na, K, Rb, Cs, or a combination thereof;
  M is independently at each occurrence Si, Ge, Sn, Ti, Zr, Al, Ga, In, Sc, Hf, Y, La, Nb, Ta, Bi, Gd, or a combination thereof;
  x is the absolute value of the charge of the $MF_y$ ion; and
  y is 5, 6 or 7.

In another aspect, processes according to the present invention include contacting a phosphor of formula I at an elevated temperature with an oxidizing agent comprising a $C_1$-$C_4$ fluorocarbon, to form the color stable $Mn^{4+}$ doped phosphor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
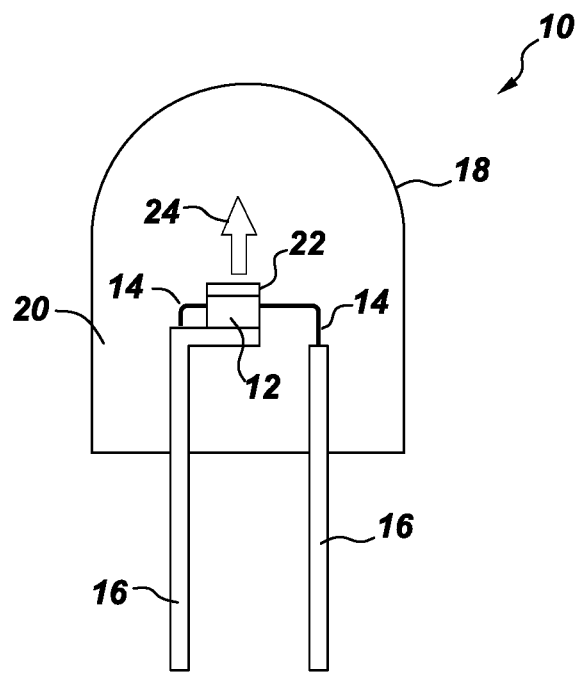
FIG. 1 is a schematic cross-sectional view of a lighting apparatus in accordance with one embodiment of the invention.

In the processes according to the present invention, a phosphor of formula I is annealed, or subjected to an elevated temperature, while in contact with an atmosphere containing a fluorine-containing oxidizing agent. The phosphor is a complex fluoride compound activated by $Mn^{4+}$. In the context of the present invention, the terms "complex fluoride compound," "complex fluoride material" and "complex fluoride phosphor" mean a coordination compound, containing at least one coordination center, surrounded by fluoride ions acting as ligands, and charge-compensated by counter ions as necessary. In one example, $K_2SiF_6$:$Mn^{4+}$, the coordination center is Si and the counterion is K. Complex fluorides are occasionally written as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

The amount of manganese in the $Mn^{4+}$ doped phosphors of formula I ranges from about 1 mol % to about 30 mol %, particularly from about 3 mol % to about 20 mol %. In embodiments where the phosphor formula I is $K_2SiF_6$:$Mn^{4+}$, the amount of manganese ranges from about 1 mol % (about 0.25 wt %) to about 25 mol % (about 6 wt %), particularly from about 2 mol % (about 0.5 wt %) to about 20 mol (about 5 wt %), and more particularly from about 2 mol % (about 0.5 wt %) to about 4 wt % (about 16.5 mol %).

In particular embodiments, the coordination center of the precursor, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of precursors of formula I include $K_2SiF_6$:$Mn^{4+}$, $K_2TiF_6$:$Mn^{4+}$, $K_2SnF_6$:$Mn^{4+}$, $Cs_2TiF_6$, $Rb_2TiF_6$, $Cs_2SiF_6$, $Rb_2SiF_6$, $Na_2TiF_6$:$Mn^{4+}$, $Na_2ZrF_6$:$Mn^{4+}$, $K_3ZrF_7$:$Mn^{4+}$, $K_3BiF_6$:$Mn^{4+}$, $K_3YF_6$:$Mn^{4+}$, $K_3LaF_6$:$Mn^{4+}$, $K_3GdF_6$:$Mn^{4+}$, $K_3NbF_7$:$Mn^{4+}$, $K_3TaF_7$:$Mn^{4+}$. In particular embodiments, the precursor of formula I is $K_2SiF_6$:$Mn^{4+}$.

In some embodiments, the phosphor is selected from the group consisting of (A) $A_2MF_5:Mn^{4+}$, where A is selected from Li, Na, K, Rb, Cs, and combinations thereof; and where M is selected from Al, Ga, In, and combinations thereof;
(B) $A_3MF_6: Mn^{4+}$, where A is selected from Li, Na, K, Rb, Cs, and combinations thereof; and where M is selected from Al, Ga, In, and combinations thereof;
(C) $Zn_2MF_7:Mn^{4+}$, where M is selected from Al, Ga, In, and combinations thereof;
(D) $AIn_2F_7:Mn^{4+}$ where A is selected from Li, Na, K, Rb, Cs, and combinations thereof;
(E) $A_2MF_6: Mn^{4+}$, where A is selected from Li, Na, K, Rb, Cs, and combinations thereof; and where M is selected from Ge, Si, Sn, Ti, Zr, and combinations thereof;
(F) $EMF_6: Mn^{4+}$, where E is selected from Mg, Ca, Sr, Ba, Zn, and combinations thereof; and where M is selected from Ge, Si, Sn, Ti, Zr, and combinations thereof;
(G) $Ba_{0.65}Zr_{0.35}F_{2.70}:Mn^{4+}$; and
(H) $A_3ZrF_7:Mn^{4+}$ where A is selected from Li, Na, K, Rb, Cs, $NH_4$; and
(I) combinations thereof.

Although the inventors do not wish to be held to any particular theory to explain the improvement in color stability that can result from subjecting the phosphor to a process according to the present invention, it is postulated that the phosphor may contain defects such as dislocations, $F^-$ vacancies, cation vacancies, $Mn^{3+}$ ions, $Mn^{2+}$ ions, $OH^-$ replacement of $F^-$, or surface or interstitial $H^+/OH^-$ groups that provide non-radiative recombination pathways, and these are healed or removed by exposure to the oxidizing agent at elevated temperature.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$, $F_3$, a $C_1$-$C_4$ fluorocarbon, or a combination thereof. Examples of suitable fluorocarbons include $CF_4$, $C_2F_6$, $C_3F_8$, $CHF_3$, $CF_3CH_2F$, and $CF_2CHF$. The fluorocarbons may be used in combination with $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The temperature at which the phosphor is contacted with the fluorine-containing oxidizing agent is ≤225° C., and particularly ≤100° C., and more particularly, about 90° C., except in embodiments where the fluorine-containing oxidizing agent is a $C_1$-$C_4$ fluorocarbon. In such embodiments, the temperature ranges from about 200° C. to about 700° C., particularly from about 500° C. to about 700° C. during contact with the fluorocarbon.

The phosphor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours. In a specific embodiment, the phosphor is contacted with the oxidizing agent for a period of at least eight hours at a temperature of about 90° C.

The manner of contacting the phosphor with the fluorine-containing oxidizing agent is not critical and may be accomplished in any way sufficient to convert the phosphor to a color stable phosphor having the desired properties. In some embodiments, the chamber containing the phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

Color stability and quantum efficiency of phosphors annealed in a process according to the present invention may be enhanced by treating the phosphor in particulate form with a saturated or nearly saturated solution of a composition of formula II $$A_xMF_y \quad\quad\quad II$$

as described in U.S. Pat. No. 8,252,613, U.S. Pat. No. 8,710,487, and US 2015/0054400. In preferred embodiments, the solution is a saturated or nearly saturated solution. A nearly saturated solution is one that contains 1-10% solvent in excess of the amount required to make a saturated solution. In one example, $K_2SiF_6:Mn^{4+}$ is treated with a nearly saturated solution $K_2SiF_6$ in aqueous HF prepared by adding approximately 1-5 vol % aqueous HF to a saturated solution of $K_2SiF_6$ in aqueous HF. in aqueous hydrofluoric acid, as described in U.S. Pat. No. 8,252,613 and U.S. Pat. No. 8,710,487. In one example, a nearly saturated solution is composed of $K_2SiF_6$ dissolved in aqueous HF. A saturated solution is prepared by adding $K_2SiF_6$ to the aqueous HF to form a suspension and filtering to remove excess solids. Then approximately 1-5 vol % aqueous HF is added to the saturated solution, to form a nearly saturated solution.

The temperature at which the phosphor is contacted with the solution is not particularly limited and may be selected according to convenience, although other parameters such as time or concentration may be adjusted at high or low temperatures to yield the desired properties of the phosphor. In particular embodiments, the temperature ranges from about 20° C. to about 50° C. The period of time required to treat the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $1+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as $LiF$, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
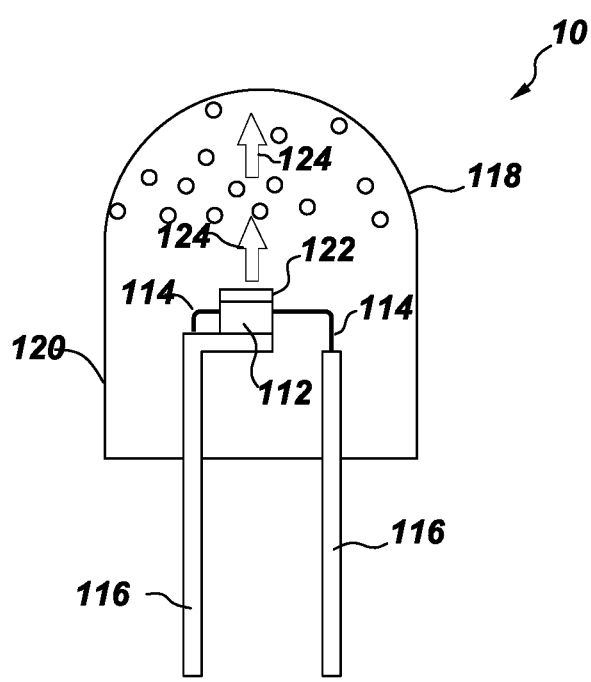
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
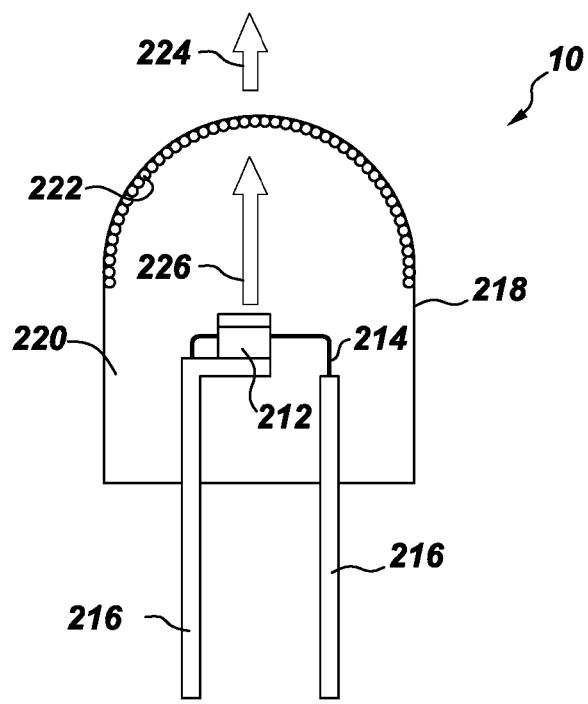
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
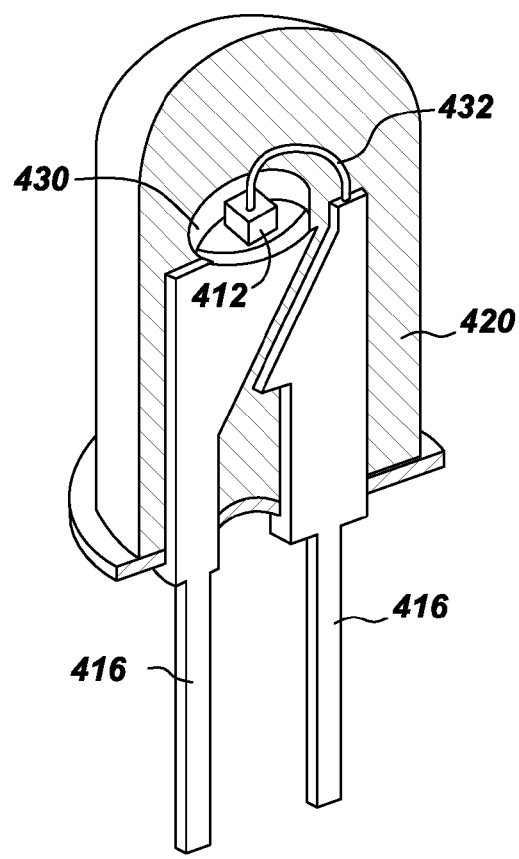
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
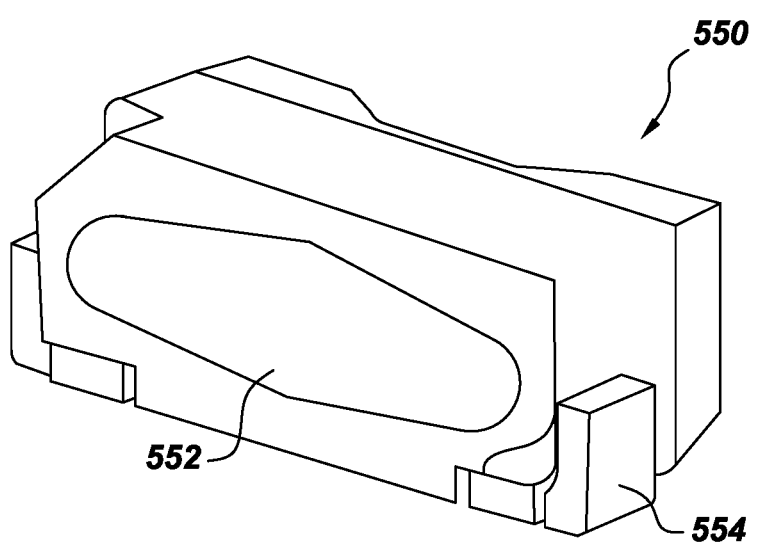
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source; and a color stable $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:

$((Sr_{1-z}(Ca, Ba, Mg, Zn)_z)_{1-(x+w)}(Li, Na, K, Rb)_w Ce_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$;

$(Ca, Ce)_3Sc_2Si_3O_{12}$ (CaSiG);

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;

$(Sr,Ca)_{10}(PO_4)_6*vB_2O_3:Eu^{2+}$ (wherein $0<v\leq1$); $Sr_2Si_3O_8*2SrCl_2:Eu^{2+}$;

$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;

$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$;

$(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$;

$CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$;

$(Ba,Sr,Ca)_\beta Si_\gamma N_\mu:Eu^{2+}$ (wherein $2\beta+4\gamma=3\mu$); $Ca_3(SiO_4)Cl_2:Eu^{2+}$;

$(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v\leq0.1$, and $0\leq w\leq0.2$); $(Y,Lu,Gd)_{2-\varphi}Ca_\varphi Si_4N_{6+\varphi}C_{1-\varphi}:Ce^{3+}$, (wherein $0\leq\varphi\leq0.5$); $(Lu,Ca,Li,Mg,Y)$, $\alpha$-SiAlON doped with $Eu^{2+}$ and/or $Ce^{3+}$; $(Ca,Sr,Ba)SiO_2N_2:Eu^{2+},Ce^{3+}$; $\beta$-SiAlON:$Eu^{2+}$, $3.5MgO*0.5MgF_2*GeO_2:Mn^{4+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq t\leq0.2$, $s+t>0$); and $(Sr, Ca)AlSiN_3: Eu^{2+},Ce^{3+}$.

Phosphor composition 22 may additionally or alternatively include quantum dot (QD) phosphors or QD materials that emit in any color. In particular, QD materials for use in phosphor composition 22 include at least one population of QDs capable of emitting green light upon excitation by a blue light source. The QD wavelengths and concentrations can be adjusted to meet the optical performance required. Preferred QD characteristics include high quantum efficiency (e.g., about 90% or greater), continuous and tunable emission spectrum, and narrow and sharp spectral emission, e.g., less than 50 nm, 30 nm or less, or 20 nm or less full width at half max (FWHM).

The quantum dot material may include a group II-VI compound, a group III V compound, a group IV-IV compound, a group IV compound, a group I-III-VI$_2$ compound or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QDs for use in phosphor composition 22 may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al, Ga, In)$_2$ (S, Se, Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the matrix material.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

LED devices incorporating the color stable phosphors and used for backlighting or general illumination lighting may have a color shift of <1.5 MacAdam ellipses over 2,000 hours of device operation, and, in particular embodiments, <1 MacAdam ellipse over 2,000 hours, where the phosphor/polymer composite is in direct contact with the LED chip surface, LED wall plug efficiency greater than 40%, and LED current densities are greater than 2 A/cm$^2$. In accelerated testing, where the phosphor/polymer composite is in direct contact with the LED chip surface, LED wall plug efficiency greater than 18%, and LED current densities are greater than 70 A/cm$^2$, LED devices may have color shift of <1.5 MacAdam ellipse over 30 minutes.

The color stable Mn$^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and intended to be not limiting.

EXAMPLES

Comparative Examples 1-2

A treatment solution composed of K$_2$SiF$_6$ dissolved in 49% HF was prepared by adding 4.2 g K$_2$SiF$_6$ per 100 ml 49% HF to form a suspension which was vacuum filtered to remove excess solids. Approximately 2 vol % 49% HF was added to the saturated solution, to form a nearly saturated solution.

Samples of Mn-doped potassium fluorosilicate phosphor, K$_2$SiF$_6$:Mn were added to separate treatment solution at a rate of about 6 ml solution per 1 g product and stirred for about 20 minutes. The treated product was vacuum filtered, rinsed once with acetic acid and three times with acetone, and then dried under vacuum. The dried powder was sifted through a 170-mesh screen, and annealed under an atmosphere composed of 20% F$_2$/80% nitrogen for about 8 hours at 540° C.

The annealed phosphor was mixed with treatment solution of 49% HF nearly saturated with K$_2$SiF$_6$ at a rate of about 12 ml solution per 1 g product and stirred for about 20 minutes. The treated product was vacuum filtered, rinsed once with acetic acid and three times with acetone, and then dried under vacuum. The dried powder was sifted through a 170-mesh screen.

Examples 1 and 2

The treated phosphors of Comparative Examples 1 and 2 were placed in a container composed of a fluoropolymer and annealed at 90° C. for 8 hours under a 20% F$_2$/80% nitrogen atmosphere.

Tapped bulk density of the phosphors of Examples 1 and 2 and Comparative Examples 1 and 2 was determined by tapping a vessel containing the phosphor and measuring the volume of the powder. Particle size data was obtained using a Horiba LA-960 Laser Scattering Particle Size Distribution Analyzer. Tapped bulk density data, quantum efficiency, lifetime, and particle size distribution for the products is shown in Table 1.

| Example no. | sample ID | bulk density (g/mL) | % density decrease | Rel. QE, % | Lifetime (ms) | d10/d50/d90 particle size, µm |
|---|---|---|---|---|---|---|
| Comparative Ex. 1 | C072215A-TGAT(133) | 0.75 | 6.4% | 103.7 | 8.449 | 17/28/47 |
| Example 1 | C072215A-TGATA(134) | 0.70 | | 103.8 | 8.45 | 16/28/49 |
| Comparative Ex. 2 | C072215B-TGAT(133) | 0.77 | 6.5% | 103 | 8.454 | 15/24/37 |
| Example 2 | C072215B-TGATA(134) | 0.72 | | 103.1 | 8.445 | 14/22/33 |

It can be seen that the phosphors of Examples 1 and 2 had lower bulk density relative to those of Comparative Examples 1 and 2, while other properties remain constant. The drop in bulk density may be due to less agglomeration of the particles which may result in improved device performance.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for synthesizing a color stable $Mn^{4+}$ doped phosphor, the process comprising
contacting a phosphor of formula I, $$A_xMF_y:Mn^{4+} \qquad \text{I}$$

with a fluorine-containing oxidizing agent in gaseous form at a temperature from 90° C. to less than 225° C. to form the color stable $Mn^{4+}$ doped phosphor;
wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $MF_y$ ion; and
y is 5, 6 or 7.

2. A process according to claim 1, wherein the fluorine-containing oxidizing agent is $F_2$, anhydrous HF, $BrF_5$, $NH_4HF_2$, $NH_4F$, $AlF_3$, $SbF_5$, $ClF_3$, $BrF_3$, KrF, $XeF_2$, $XeF_4$, $NF_3$, or a combination thereof.

3. A process according to claim 1, wherein the fluorine-containing oxidizing agent comprises $F_2$.

4. A process according to claim 1, wherein M is Si, Ge, Sn, Ti, Zr, or a combination thereof.

5. A process according to claim 1, wherein
A is Na, K, Rb, Cs, or a combination thereof;
M is Si, Ge, Ti, or a combination thereof; and
Y is 6.

6. A process according to claim 1, wherein the phosphor is $K_2SiF_6:Mn^{4+}$.

7. A process according to claim 1, additionally comprising contacting the color stable $Mn^{4+}$ doped phosphor in particulate form with a saturated solution of a composition of formula II in aqueous hydrofluoric acid $$A_xMF_y. \qquad \text{II}$$

8. A process for synthesizing a color stable $Mn^{4+}$ doped phosphor, the process comprising contacting a phosphor of formula I, $$A_xMF_y:Mn^{4+} \qquad \text{I}$$

at an elevated temperature with a fluorine-containing oxidizing agent to form the color stable $Mn^{4+}$ doped phosphor, the fluorine-containing oxidizing agent comprises a compound selected from the group consisting of: $F_2$, anhydrous HF, $BrF_5$, $NH_4F$, $AlF_3$, $SF_6$, $SbF_5$, $ClF_3$, KrF, $XeF_4$, $NF_3$, $PbF_2$, $ZnF_2$, $SiF_4$, $SnF_2$, $CdF_2$, a $C_1$-$C_4$ fluorocarbon and a combination thereof; and
contacting the color stable $Mn^{4+}$ doped phosphor in particulate form with a saturated solution of a composition of formula II in aqueous hydrofluoric acid $$A_xMF_y \qquad \text{II}$$

wherein
A is independently at each occurrence Li, Na, K, Rb, Cs, $NR_4$ or a combination thereof;
M is independently at each occurrence Si, Ge, Sn, Ti, Zr, Al, Ga, In, Sc, Hf, Y, La, Nb, Ta, Bi, Gd, or a combination thereof;
R is H, lower alkyl, or a combination thereof;
x is independently at each occurrence the absolute value of the charge of the $MF_y$ ion; and
y is independently at each occurrence 5, 6 or 7.

9. A process according to claim 8, wherein the temperature ranges from about 200° C. to about 700° C.

10. A process according to claim 8, wherein the temperature ranges from about 350° C. to about 600° C.

11. A process according to claim 8, wherein the phosphor is contacted with the fluorine-containing oxidizing agent for a period of at least four hours.

12. A process according to claim 8, wherein M is Si, Ge, Sn, Ti, Zr, or a combination thereof.

13. A process according to claim 8, wherein
A is Na, K, Rb, Cs, or a combination thereof;
M is Si, Ge, Ti, or a combination thereof; and
Y is 6.

14. A process according to claim 8, wherein the phosphor is $K_2SiF_6:Mn^{4+}$.

15. A process according to claim 8, wherein the fluorine-containing oxidizing agent is a $C_1$-$C_4$ fluorocarbon.

16. A process according to claim 15, wherein the fluorine-containing oxidizing agent further comprises $F_2$.

17. A process according to claim 15, wherein the $C_1$-$C_4$ fluorocarbon is selected from $CF_4$, $C_2F_6$, $C_3F_8$, $C_2H_2F_4$, $C_2HF_3$, and combinations thereof.

18. The process according to claim 17, wherein the $C_1$-$C_4$ fluorocarbon is $CF_4$.

* * * * *